(12) United States Patent
Du et al.

(10) Patent No.: US 6,275,720 B1
(45) Date of Patent: Aug. 14, 2001

(54) ITERATIVE METHOD FOR REDUCING ERRORS IN NAVIGATOR ECHO MR IMAGING

(75) Inventors: Yiping Du, Towson; Thomas K. F. Foo, Rockville, both of MD (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/270,351

(22) Filed: Mar. 16, 1999

(51) Int. Cl.$^7$ ..................................................... A61B 5/055
(52) U.S. Cl. ........................... 600/410; 324/307; 324/309
(58) Field of Search ............................. 600/410; 324/307, 324/309

(56) References Cited

U.S. PATENT DOCUMENTS

| 5,185,574 | * | 2/1993 | Ehman et al. | 324/309 |
| 5,427,101 | * | 6/1995 | Sachs et al. | 600/410 |
| 6,067,465 | * | 5/2000 | Foo et al. | 600/410 |
| 6,073,041 | * | 6/2000 | Hu et al. | 600/410 |

OTHER PUBLICATIONS

Foo, et al, "Three–dimensional double–oblique coronary artery MR imaging using real–time respiratory navigator and linear phase–shift processing", Proc. of ISMRM, p. 323 (1998).
Foo, et al, "An Efficient Method for Calculating Displacement in MR Navigators Using Linear Phase Shifts", Radiology 1997; vol. 205 (P), p. 213.
Ahn, et al, "A new phase correction method in NMR imaging based on autocorrelation and histogram analysis.", IEEE Trans. Med. Imaging, 1987: MI–6: 32–36.

* cited by examiner

*Primary Examiner*—Brian L. Casler
(74) *Attorney, Agent, or Firm*—Jenkens & Gilchrist, P.C.

(57) ABSTRACT

A method is disclosed for providing a time efficient and accurate measure of the absolute positional displacements of a reference structure in navigator echo MR imaging. The method comprises the steps of operating an MR system to acquire a reference navigator echo associated with the object at a specified reference position, and applying an MR sequence to the object to acquire a set of MR image data when the object is selectively displaced from the reference position. The data set includes an acquired navigator echo having a specified field of view. The method further comprises truncating the acquired navigator echo by means of a selectively positioned truncation window, calculating the difference between linear phase shifts respectively associated with acquired and reference navigator echoes, and displacing the truncation window by an amount representing or corresponding to the phase shift difference in spatial units. Thereupon, the truncating, difference calculation, and truncation window displacement steps are iteratively repeated a specified number of times or when the calculated displacements converge to zero, to provide a final phase shift difference value and an absolute spatial displacement of a reference structure. The final value is used to determine the displacement of the object from the specified reference position when the MR data set is acquired.

24 Claims, 4 Drawing Sheets

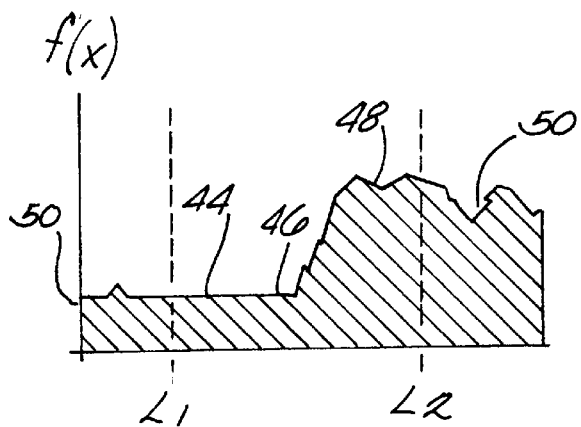
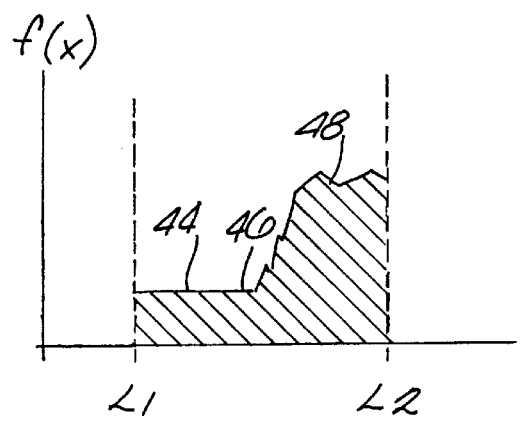
FIGURE 2A                FIGURE 2B
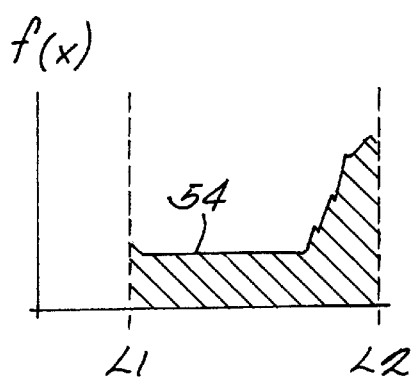
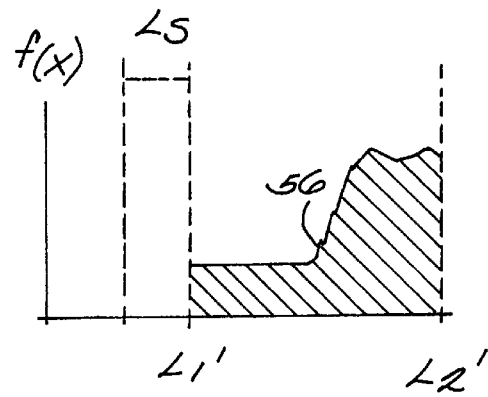
FIGURE 2C                FIGURE 2D

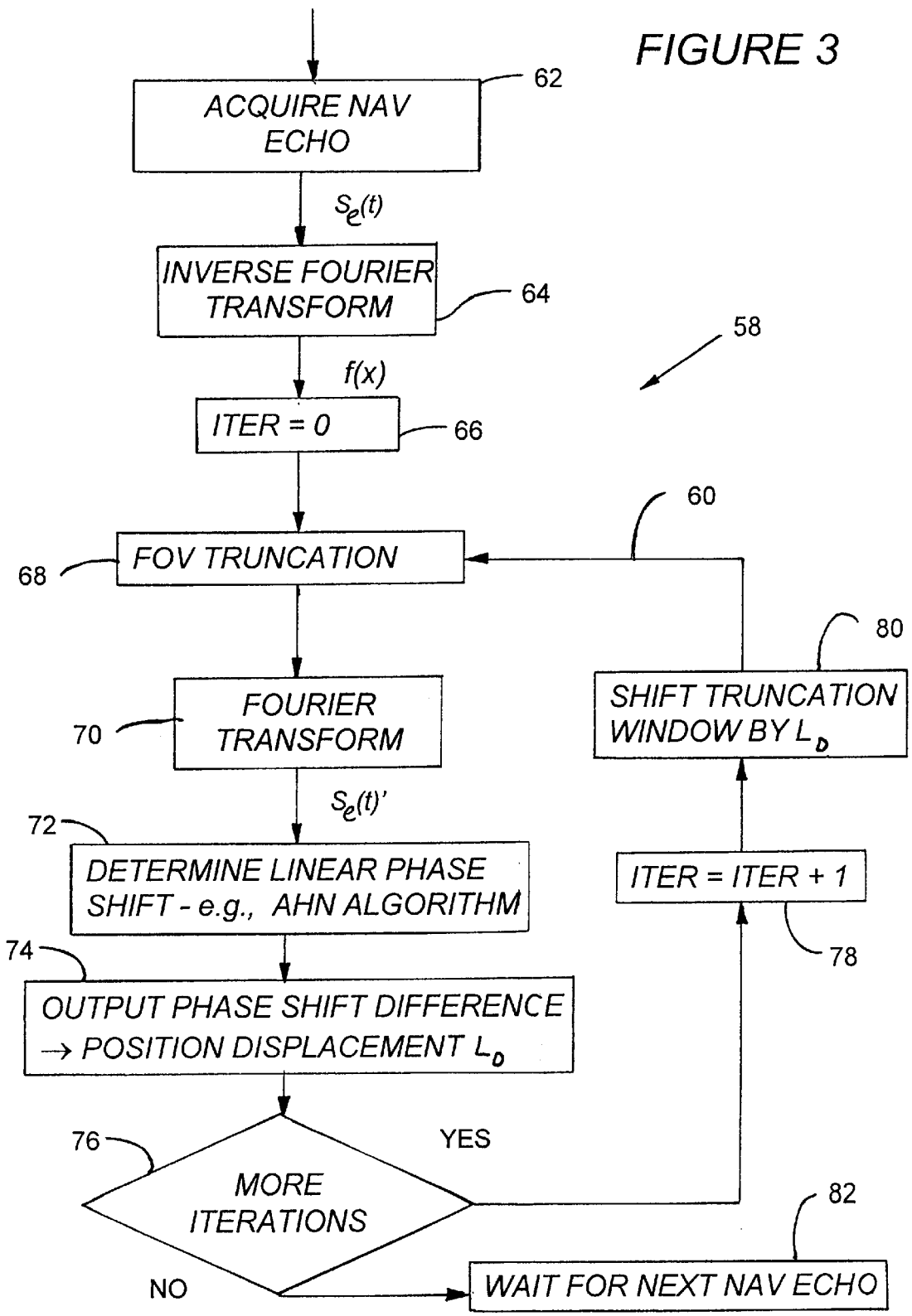

ITERATIVE METHOD FOR REDUCING ERRORS IN NAVIGATOR ECHO MR IMAGING

BACKGROUND OF THE INVENTION

The invention generally pertains to a method for improving measurement accuracy in a navigator echo technique used in magnetic resonance (MR) imaging. More particularly, the invention pertains to a method of such type for improving the accuracy for measuring the absolute positional displacement in navigator navigator profiles when using a truncation window, to remove undesirable MR signal from peripheral regions of the navigator profile. As is well known by those of skill in the art, the navigator echo technique is commonly used in connection with respiratory gating, to reduce respiratory motion artifacts in MR imaging, especially in the MR imaging of the heart. In such applications, imaging is directed to anatomic structure such as the liver and lungs, which move with a patient's diaphragm during the respiratory cycle. In the navigator gating technique, a navigator pulse is applied prior to the image data acquisition sequence, to acquire a navigator echo. The acquired echo is then used to determine the displacement of the diaphragm at the time of data acquisition. This is achieved by employing a selected algorithm to compare the acquired navigator echo with a reference navigator echo, obtained prior to data acquisition as part of a set of preliminary data. The reference navigator echo is associated with a specified reference position of a patient's diaphragm, which generally moves periodically along the superior/interior direction during successive respiratory cycles. If the diaphragm is found to lie within a particular displacement window with respect to a reference position, at the time of data acquisition, the acquired MR image data will be accepted. Otherwise, the data will be rejected. Thus, the navigator gating technique comprises an "accept or reject" system. By using only accepted data in image reconstruction, artifacts caused by respiratory motion can be significantly reduced in MR coronary artery imaging or in abdominal MR imaging. The reference position may be selected as that position that corresponds to a particular phase of the respiratory cycle. The preferred position is at end-expiration as it is the most reproducible and consistent phase of the respiratory cycle, i.e., there is usually minimal variation between diaphragm displacement positions between end-expiration phases in successive respiratory cycles.

In the past, different algorithms have been used in connection with echo gating, such as auto-correlation and least-squares algorithms, to determine displacement of the diaphragm as a function of time. However, while these algorithms have been effective in reducing respiratory artifacts in coronary imaging, they typically require substantial computation effort. Frequently, the level of required effort has exceeded the capability of available computational platforms found on certain currently used MR scanning systems. Accordingly, as an alternative, a linear phase-shift algorithm has been developed by T. K. F. Foo, one of the inventors herein, and K. F. King for the measurement of diaphragm position This is set forth in U.S. patent application Ser. No. 08/980,192, filed Nov. 26, 1997 by Foo T K F and King K F. Such application is commonly assigned herewith to the General Electric Company, and is entitled "Fast method for detection and tracking of reference position changes in magnetic resonance imaging". This algorithm, which is now used in MR scanners for prospective navigator gating in 3-D MR coronary angiography, has been found to provide a ten-fold improvement in computational efficiency, and is further described, for example, in an article by Foo, et al entitled "Three-dimensional double-oblique coronary artery MR imaging using real-time respiratory navigator and linear phase-shift processing", Proc. of ISMRM, p. 323 (1998), and in another article by Foo, et al., entitled "An Efficient Method for Calculating Displacement in MR Navigators Using Linear Phase Shifts", Radiology 1997; vol.205 (P), page 213.

In navigator gating using the linear phase-shift algorithm, an acquired navigator echo is inverse Fourier transformed to the frequency domain, to provide a corresponding navigator profile. The navigator profile in the frequency domain is then truncated, to remove undesirable signal from peripheral regions of the navigator profile. More specifically, the navigator echo has an acquisition field of view (FOV) which typically is on the order of 10–20 centimeters. The navigator profile is truncated in the frequency domain by applying a truncation window thereto, which has the effect of reducing the acquisition field of view. The truncated navigator profile is then Fourier transformed back to the time domain. The relative position of the navigator profile can be determined from the linear phase shift of the time domain representation of the truncated navigator profile. One method to determine the linear phase shift in an efficient manner is a method proposed by Ahn, et al., "A new phase correction method in NMR imaging based on autocorrelation and histogram analysis.", IEEE Trans. Med. Imaging, 1987: MI-6: 32–36. By comparing the linear phase shifts between any two profiles, the relative displacement between the two profiles can be measured. The linear phase shift of any one profile corresponds to a relative position of the measured object, this being the top of the right hemi-diaphragm if the respiratory motion is to be monitored.

The algorithm proposed by Foo and King has the advantage of not requiring a reference profile to calculate the positional displacement. As the linear phase shift provides a measure corresponding to that of the position of the diaphragm, for example, the end-expiration position can either be that where the linear phase shift is at maximum or minimum, depending on patient orientation and the direction of the applied read out gradient of the navigator echo MR experiment.

Notwithstanding the benefits of the linear phase-shift algorithm technique described above, it has been found that FOV truncation of a navigator profile, as required by such technique, introduces another source of measurement error. The technique described above may have accurate measures of relative position but poor measures of absolute position. Absolute positional measures are needed when more elaborate motion correction schemes are employed rather than a simple "accept/reject" scheme. One possible use of absolute positional displacement measures is to apply a displacement correction to the acquired MR data, thus allowing a higher efficiency of acquisition by being able to acquire MR data at a greater range of respiratory phases rather than just at end-expiration. One example of such a scheme, known as adaptive navigator echo correction, is described in an article by McConnel et al., "Prospective adaptive navigator correction for breath-hold MR coronary angiography." Magn. Reson. Med. 1997; 37: 148–152.

In an ideal case, when the acquired navigator profile is the same for each acquisition, the difference between the linear phase shifts of any two profiles represents the displacement between the two profiles. However, a spatially fixed FOV truncation window and motion of the diaphragm may cause the navigator profiles to become different. This is especially so if blood vessels or other heterogeneous structures in the liver move into and out of the truncation FOV window, introducing new structures in the navigator profile and hence, altering the linear phase shift of the navigator profile. Using different or dissimilar navigator profiles i result in the undesired measurement error in the linear phase shift. This poses a potential problem if the absolute displacement from a reference position, sometimes taken as the mean end-expiration position, is to be calculated.

SUMMARY OF THE INVENTION

The invention is generally directed to providing a more efficient and accurate method for measuring absolute positional displacements in a navigator echo MR imaging technique, wherein the navigator echo technique is used to acquire an image of an object which experiences respiratory or other periodic motion. The method comprises the steps of operating an MR system to acquire a reference navigator echo associated with the object. The method further comprises applying an MR image sequence to the object, to acquire a corresponding MR data signal which includes an acquired navigator echo having a specified initial field of view, and applying an inverse Fourier transform to the acquired navigator echo to provide a navigator profile in the frequency domain. The field of view of the navigator profile is truncated by applying a truncation window thereto. The truncated navigator profile is Fourier transformed to provide a processed navigator echo in the time domain. The linear phase shift of the processed navigator echo is calculated using any efficient algorithm, such as Ahn's algorithm. The linear phase shift of the processed navigator echo is selectively compared with the linear phase shift of a navigator echo profile that corresponds to the reference position, taken as the mean end-expiration position, to determine the diaphragm displacement therebetween. The truncation window is then spatially displaced by an amount which is functionally related to the difference of the phase shifts. Thereupon, the truncation, Fourier transform, comparison and displacement steps respectively described above are iteratively repeated a number of times. As the truncation window is spatially shifted in each successive iteration, the linear phase shift calculated in each successive iteration converges to that value that corresponds to the navigator profile at a reference position. The final displacement of the navigator profile from the reference position is then the sum of the spatial shifts of the truncation window and the final difference between the calculated linear phase shift and that of the reference position. If $d_0, d_1, \ldots, d_n$ represent the spatial shifts of the truncation window in integer pixels, and $s_0, s_1, \ldots, s_n$ represent the displacement calculated from the linear phase shifts for n iterations, the parameters used in each iteration can be written as:

| iteration | truncation window shift | calculated navigator displacement |
|---|---|---|
| 0 | $d_0 = 0$ | $s_0$ |
| 1 | $d_1 = s_0$ | $s_1$ |
| 2 | $d_2 = s_0 + s_1$ | $s_2$ |
| . | . | . |
| . | . | . |
| . | . | . |
| n | $d_n = s_0 + s_1 + \ldots + s_{n-1}$ | $s_n$ |

Eqn. (1)

As the calculated navigator profile displacement is given by $$s_i = (\phi_r - \phi_i) \frac{N}{\pi}$$

in terms of pixels, where $(\phi_r - \phi_i)$ is the difference between the linear phase shift of the reference position and that of the ith iteration, and N is the number of pixels in the navigator acquisition, the calculated navigator displacement can be in fractional pixels while that of the truncation window spatial shifts must be rounded to the nearest whole integer (pixel) value. Hence, the process can be halted after some fixed number of iterations, perhaps three, or when $s_i < 1$ pixel. The displacement of the navigator echo profile is then $$\text{displacement} = d_n + s_n \qquad \text{Eqn. (2)}$$

where n is the final iteration.

In a preferred embodiment, the Ahn algorithm or any suitable time-efficient algorithm is employed to determine the phase shifts of the acquired navigator echo and that of the reference navigator profile. Preferably, two or three iterations are carried out to determine the final displacement value or the above-described convergence criteria can be used. In a useful embodiment, the initial field of view is truncated to provide a navigator profile representing a patient's liver, lungs or other structures which move with the patient's diaphragm, while removing navigator profile signal components associated with the anatomic structures that have different motion than the diaphragm.

BRIEF DESCRIPTION OF THE DRAWINGS

FIGS. 2A–2D are schematic diagrams showing respective frequency domain navigator profiles associated with an embodiment of the invention.

FIG. 3 shows a flowchart illustrating respective steps for an embodiment of the invention.

DETAILED DESCRIPTION OF THE PREFERRED EMBODIMENT

Figure 1:
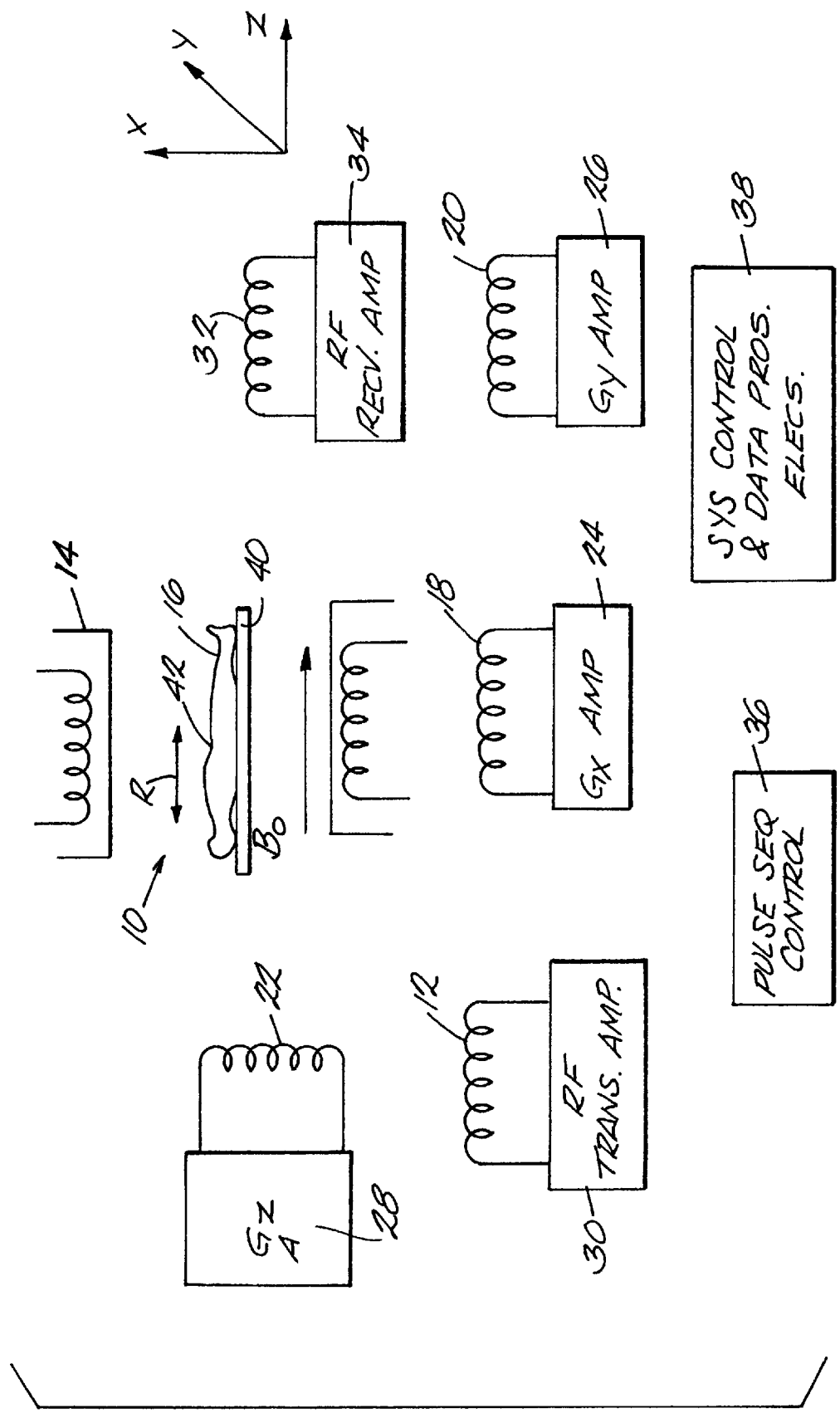
FIG. 1 is a schematic diagram showing basic components of an MR system for use in practicing an embodiment of the invention.

Referring to FIG. 1, there are shown the basic components of an MR system or scanner 10 which may be operated to acquire MR data in accordance with the invention described herein. System 10 includes an RF transmit coil 12, as well as a cylindrical magnet 14 for generating a main or static magnetic field $B_0$ in the bore thereof. RF coil 12 is operated to transmit RF excitation signals into a patient or other subject of imaging 16 residing in the magnet bore, in order to produce MR signals. System 10 further includes gradient coils 18, 20 and 22 for generating $G_x$, $G_y$, and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30. FIG. 1 further shows an RF coil 32, which is operated in association with a receive amplifier 34 to acquire MR signals from subject 16. In some arrangements, coil 32 and coil 12 comprise the same RF coil, which is operated in alternate modes during the imaging sequence. System 10 is further provided with a pulse sequence control 36, which is operated to control the RF and gradient amplifiers, and to thereby generate pulse sequences to produce and acquire sets of MR signals. System 10 also includes system control and data processing electronics 38 for operating respective components of system 10 to acquire MR data, to process the data in accordance with the invention, and to construct images therefrom. The construction, functions, and interrelationships of components of MR system 10 are well known and described in the prior art, such as in U.S. Pat. No. 5,672,969, issued Sep. 30, 1997 to Zhou et al.

Referring further to FIG. 1, there is shown patient 16 supported on a table 40 or the like so that the chest and cardiac region 42 of the patient is positioned within the bore of main magnet 14. The patient's diaphragm, as well as anatomic structure attached thereto such as the liver and lungs, moves along an axis R, during the course of successive respiratory cycles. Thus, displacement of the diaphragm and related structure, with respect to a reference position, varies periodically as a finction of time. For purposes of description, the axis R is usefully considered to lie along the Z-axis of scanner 10.

As stated above, the navigator echo technique is used in 3D MR coronary artery imaging or general abdominal body MR imaging to determine the position of a patient's diaphragm, at the time that an MR image sequence is applied thereto. If the diaphragm is within a specified displacement window, i.e., a particular range of displacements with respect to a reference position, MR data produced by the sequence are accepted for use in image reconstruction. Otherwise, the data are not accepted. As stated further, a navigator pulse is included in the sequence to generate a navigator echo. The linear phase shift of the acquired navigator echo is compared with the linear phase shift of the reference navigator echo to provide a measurement of diaphragm displacement.

In conventional practice, the acquired navigator echo may have an acquisition FOV which is on the order of 10–20 centimeters. Such field of view is large enough to include undesirable anatomic structures as well as structures which move with the diaphragm. When the navigator echo is transformed into the frequency domain, the undesirable structures in the peripheral regions of the corresponding navigator profile have been found to reduce accuracy in measuring diaphragm displacement. This is illustrated by FIG. 2A, which shows a frequency domain navigator profile 44 of a navigator echo, acquired in accordance with the technique described above. Profile 44 has regions 46 and 48 which represent the lung and liver of a patient, respectively. However, profile 44 also has regions 50 and 52, which represent undesirable anatomic structures and which thereby introduce absolute position displacement measurement errors. Furthermore, the fact that profile 44 also has a non-zero signal in the lung field 46, also increases the absolute displacement position measurement error.

Referring to FIG. 2B, there is shown an FOV truncation window applied to navigator profile 44, so that regions 50 and 52 are eliminated therefrom. The truncation window acts to reduce the field of view of the corresponding navigator echo. Accordingly, signal components representing the truncated regions are eliminated therefrom. However, the non-zero signal of the lung field 46 remains. It is to be understood that the truncation window of FIG. 2B described above provides a fixed FOV truncation of the navigator profile. That is, the truncation window must remain positioned between boundaries $L_1$ and $L_2$ in the frequency domain. Thus, if the window is applied to two profiles which are identical, except that one of them has been shifted in the frequency domain, the resulting truncated profiles will be different. This is illustrated by FIG. 2C, which shows a truncated profile 54. It will be apparent that truncated profile 44 of FIG. 2B and truncated profile 54 of FIG. 2C are different, even though the same fixed FOV truncation window has been used in each case. This represents the motion of the diaphragm as detected in the navigator echo profile. Profile 44 could be construed as corresponding to a reference position, and profile 54 could be derived from the measured or acquired navigator echo. The two profiles would be the same, except that the acquired profile would be shifted with respect to the reference profile, in corresponding relationship to displacement of the diaphragm from a specified reference position, as the result of respiratory motion. As stated above, it is desirable to use a time-efficient algorithm, an example of which is Ahn's algorithm, to determine diaphragm displacement, by selectively processing the linear phase shift between that of the navigator profile and that corresponding to a reference position. However, if the lung field signal 46 is non-zero or if other structures that are not present in the reference profile are introduced into the navigator profile, errors in the determination of the absolute positional displacement will arise.

In accordance with the invention, it has been recognized that if the FOV truncation window were to be displaced by the proper amount, a shifted navigator profile truncated thereby could be made to be substantially identical to a corresponding fixed profile, which was truncated by a fixed FOV window, even if the lung field 46 is non-zero. This is illustrated by FIG. 2D, which shows a shifted navigator profile 56 which is identical to the fixed profile 44 of FIG. 2B. The truncation window for profile 56 has been shifted in the frequency domain by $L_s$. It is to be understood that in order to achieve an identical relationship between the two navigator profiles, it is necessary to develop a technique for determining a particular value of $L_s$ that will accomplish such result.

Ahn's algorithm is set forth, for example, in an article by C. B. Ahn and Z. H. Cho, entitled "A new phase correction method in NMR imaging based on auto-correlation and histogram analysis", IEEE Trans. Med. Imaging MI-6, 32–36 (1987). By processing the time domain representation of a navigator profile in accordance therewith, a linear phase shift $\phi$ is provided. The difference between the linear phase shifts of the time domain representation of the truncated (acquired) navigator profile and the reference profile, $\Delta\phi$, represents the spatial separation between these profiles. Accordingly, $\Delta\phi$ can be used to determine displacement of a patient's diaphragm from a specified reference position. If $f(x)$ represents the navigator echo profile in the frequency domain and $F(k)$ represents the time domain representation obtained using the inverse Fourier transform operation on $f(x)$, the linear phase shift is then, $$\phi = -arg(E[F(k) \cdot F^*(k+1)]) \qquad \text{Eqn. (3)}$$

where E[ ] denotes the expectation value and * denotes the complex conjugate. The displacement from the reference profile is then given as $$displacement = (\phi - \phi_r)\frac{\pi}{N}. \qquad \text{Eqn. (4)}$$

If the lung field 46 is non-zero, or the profile of the liver (48) changes as a function of respiration due to heterogeneous structure moving into and out of the truncation window, then the displacement that is calculated would not accurately represent the true displacement due to reasons already outlined above. In this case, then by spatially shifting the truncation window (or equivalently, shifting the navigator profile into the truncation window), the linear phase shift of the time domain representation and that of the reference profile can be made to converge to zero, giving the true displacement between the navigator profile and that of the reference profile.

In FIG. 2B, the navigator profile 46 is shown as being truncated between the limits $L_1$ and $L_2$. If this is the reference profile, the linear phase shift of its time domain representation is $\phi_B$. In FIG. 2C, the profile is shifted as a result of respiratory motion. If the navigator profile is truncated again between limits $L_1$ and $L_2$, the difference between the linear phase shift of the time domain representation of this profile, $\phi_C$, and that of FIG. 2B, $\phi_B$, does not exactly correspond to the displacement between these two profiles, primarily due to the error caused by the non-zero signal in the lung field 46, or the profile of the liver (48) changes as a function of respiration due to heterogeneous structure moving into and out of the truncation window.

If we now use the apparent displacement calculated from the difference in the linear phase shifts, $$L_S = |(\phi_C - \phi_B)| N/\pi \qquad \text{Eqn. (5)}$$

to shift the truncation window, as shown in FIG. 2D, the resulting navigator profile in the truncation window now more closely resembles the profile of FIG. 2B. Hence, the linear phase shift calculated from the time domain representation of the new profile converges to that of $\phi_B$. The absolute positional displacement corresponds then to the spatial shift of the navigator window plus the final displacement calculated from the linear phase shift. This process can be iterated several times until the displacement calculated from the linear phase shift is less than a pixel or for a fixed number of iterations. It has been determined that no more than three iterations are normally needed for an accurate measure of the absolute positional displacements.

Note that the spatial shift of the truncation window is equivalent to shifting the navigator profile into or out of the truncation window region.

In accordance therewith, FIG. 3 shows a flowchart 58, which represents respective steps of a method comprising an embodiment of the invention, and which includes an iterative process loop 60. As indicated by process block 62, the method commences with acquisition of a navigator echo representing the position of a patient's diaphragm, with respect to a specified reference position, at a particular time during the respiratory cycle. As stated above, the navigator echo is acquired as part of an MR imaging sequence, directed to anatomic structure which moves with a patient's diaphragm. The imaging sequence is implemented by the RF and gradient coils of MR scanner 10, together with other components thereof. The acquired navigator echo, comprising a function of time $S_e(t)$, is inverse Fourier transformed to the frequency domain, as shown by process block 64, to provide a navigator profile f(x) The navigator profile is supplied to FOV truncation process block 68, together with a signal from process block 66 which indicates that the iterative loop 60 is to commence an initial cycle of operation.

Process block 68 truncates the navigator profile so that only the central portion (for example, only half of the FOV) of the image represented by the profile remains. The truncated navigator profile is then transformed back to the time domain, as indicated by process block 70, the result comprising a processed navigator echo $S_e(t)'$. A linear phase shift $\phi_l$ is calculated by applying the Ahn algorithm or any other suitable time-efficient algorithm to the processed navigator echo, in accordance with process block 72 and Eqn. (3), from which a spatial displacement can be determined, in accordance with Eqns. (4–5). A linear phase shift $\phi_r$ is also calculated, by applying the Ahn algorithm or any other suitable time-efficient algorithm to a truncated navigator profile that constitutes a reference profile, after truncation in the same manner as the initial processed navigator echo $S_e(t)'$. Linear phase shifts $\phi_l$ and $\phi_r$ are directed to a process block 74, which determines $\phi_d = \phi_l - \phi_r$, the difference between linear phase shifts $\phi_l$ and $\phi_r$. The spatial displacement, $L_D$, is then derived in accordance to Eqn. (5) and then applied to decision block 76. It is to be understood that the displacement, $L_D$, of the diaphragm from the reference position, is provided by the linear phase shift difference $\phi_d$ in accordance with the relationship as stated in Eqn. (5), in pixels. Note that a spatial displacement in units of distance can be obtained from Eqn. (5), where, $$\text{displacement}, L_D = |\phi_C - \phi_B| N/\pi \times \text{FOV}/N$$

$$L_D = |(\phi_l - \phi_r)| \text{FOV}/\pi \qquad \text{Eqn. (6)}$$

where FOV is the image field-of-view given in terms of units of distance and N represents the number of pixels corresponding to that given field-of-view. Hence, if FOV is given in units of mm, then in accordance with Eqn. (6), $L_D$ can also be converted into units of mm. However, since the image is usually in discrete integer format, all distances are given in units of pixels. Hence, any spatial shifts are given in terms of the pixels, where the pixel size is given as FOV/N.

Decision block 76, in accordance with a pre-specified criterion, may route the linear phase shift difference $\phi_d$ (and the equivalent spatial shift, $L_D$) around the iterative process loop 60, through process blocks 78 and 80. Process block 78 keeps track of successive iterations. Process block 80 shifts the truncation window for the next iteration by the same amount $L_D$ (where $L_D$ is rounded to the nearest whole integer pixel displacement) which thus serves as an estimate of the "true" displacement. The shift of the truncation window reduces the disparity between the acquired and reference navigator profiles of the diaphragm during respiratory motion. After shifting the position of the truncation window, the new truncated navigator profile is Fourier transformed back into the time domain. A linear phase shift is then calculated using the Ahn algorithm, as described previously, to provide a new linear phase shift difference $\phi_d$, and a new spatial displacement, $L_D$, of the acquired navigator profile relative to the reference navigator profile.

In an embodiment of the invention, a useful criterion for decision block 76 is simply to execute two or three iterations. The value of $L_D$ after the final iteration approaches the ideal or true spatial displacement, $L_S$ for shifting the truncation window, as described above in connection with FIG. 2D. After the final iteration, decision block 76 directs process block 82 to wait for the next navigator echo to be generated by scanner 10. It will be seen that data processor 38 of MR system 10 may be employed to perform the Fourier transform operations shown in FIG. 3, as well as the respective operations of iterative process loop 60.

Figure 4:
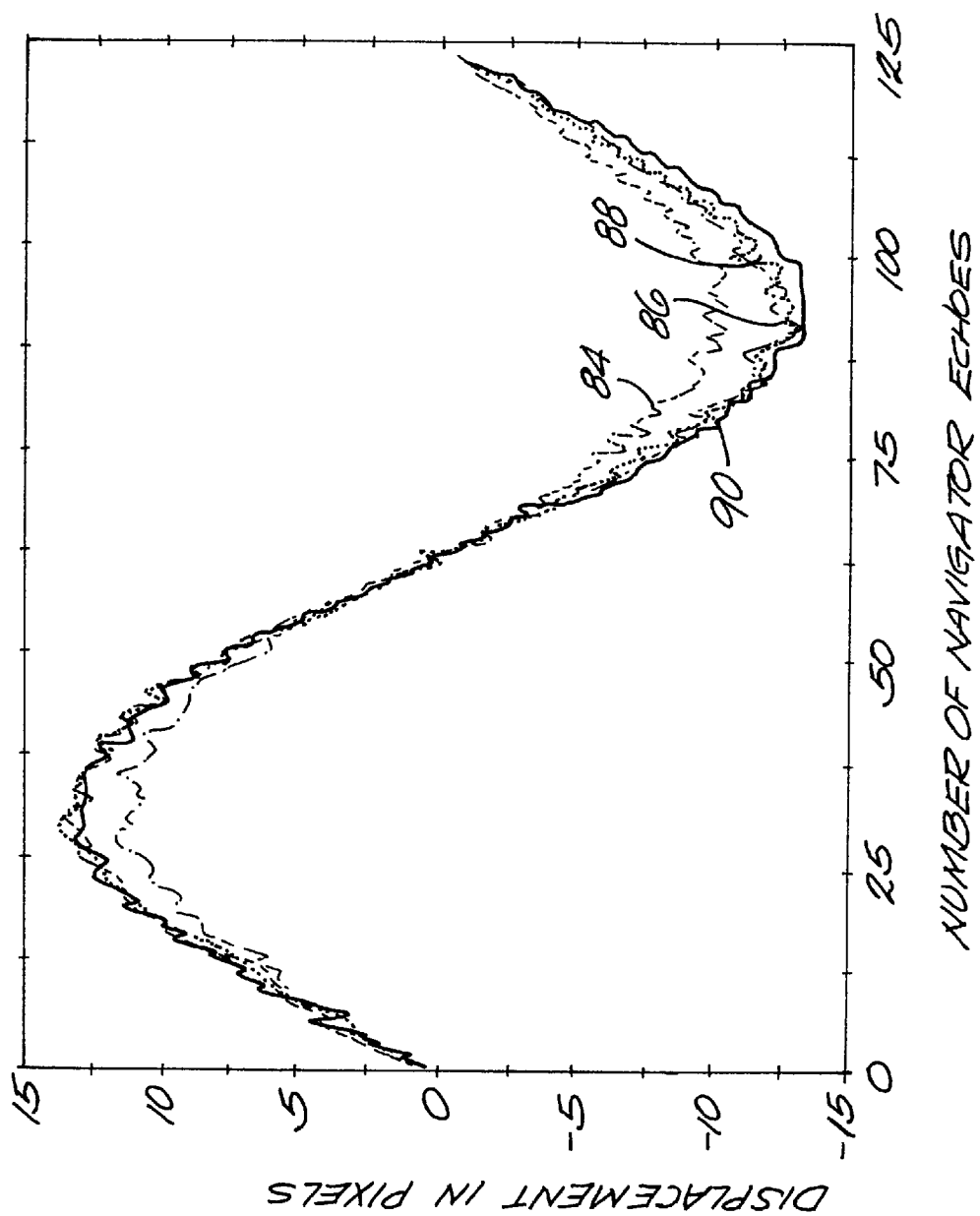
FIG. 4 is a graph illustrating the effectiveness of the embodiment of FIG. 3 in reducing measurement errors.

Referring to FIG. 4, there are shown results of applying the iterative method set forth in FIG. 3 to simulated respiratory motion, with respect to a simulated object having a high intensity (with a value of 200) on one side and a low intensity (with a value of 50) on the other side. The measured displacement of the object for each of first, second, and third iterations 84–88, respectively, is shown in FIG. 4 for a complete respiratory cycle. The true displacement 90 of the object is also plotted therein. FIG. 4 indicates that the measurement of absolute positional displacement converges rapidly after the second iteration 86, and and does not vary significantly after the third iteration 88.

Obviously, other modifications and variations of the present invention are possible in light of the above teachings. It is therefore to be understood that within the scope of the disclosed concept, the invention may be practiced otherwise than as specifically described.

What is claimed is:

1. A method for producing more accurate absolute positional displacement measurements in a time-efficient manner in navigator echo MR imaging of an object disposed to experience periodic motion, said method comprising the steps of:

(a) operating an MR system to acquire a reference navigator echo associated with said object when said object is at a specified reference position;

(b) applying an MR sequence to said object to acquire a set of MR image data when said object is selectively displaced from said reference position, said data set including an acquired navigator echo having a specified field of view;

(c) applying an inverse Fourier transform to said acquired navigator echo to provide a navigator profile in the frequency domain;

(d) truncating the field of view of said navigator profile by applying a truncation window thereto;

(e) Fourier transforming said truncated navigator profile to provide a processed navigator echo in the time domain, (f) calculating a difference between linear phase shifts respectively associated with said processed navigator echo and said reference navigator echo;

(g) displacing said truncation window by an amount representing said difference of said linear phase shifts, after suitable conversion of said linear phase shifts to its corresponding spatial shift;

(h) performing a specified number of iterations of the method steps (d)–(g), the phase shift difference which is determined by a final iteration of said specified number of iterations comprising a final phase shift value; and (i) employing said final phase shift value, after suitable conversion to its corresponding spatial value to determine the displacement of said object from said specified reference position when said MR data set is acquired.

2. The method of claim 1 wherein:

said object comprises anatomic structure of a patient which is disposed to move with the patient's diaphragm during successive respiratory cycles.

3. The method of claim 2 wherein:

a selected time-efficient algorithm is implemented to determine the linear phase shifts of said acquired navigator echo and said reference navigator echo.

4. The method of claim 3 wherein:

said selected time-efficient algorithm comprises an Ahn algorithm.

5. The method of claim 3 wherein:

the number of said iterations does not exceed three, and is a number which is less than three if the calculated displacements converge to zero in a number of iterations which is less than three.

6. The method of claim 5 wherein:

said truncation step comprises applying a truncated field-of-view which is centered at the center of said specified field-of-view, such that it encompasses the full range of respiratory motion, said truncated field-of-view comprising a selected fraction of said specified field-of-view.

7. The method of claim 6 wherein:

said acquired MR image data comprises data for imaging any part of the anatomy where motion will degrade image quality.

8. The method of claim 7 wherein:

said acquired MR image data comprises data for coronary MR imaging.

9. The method of claim 7 wherein:

said acquired MR image data comprises data for abdominal body MR imaging.

10. A method for constructing an MR image of an object disposed to experience periodic motion, said method comprising the steps of:

operating an MR system to acquire a reference navigator echo associated with said object when said object is at a specified reference position;

applying an MR sequence to said object to acquire a set of MR image data when said object is selectively displaced from said reference position, said data set including an acquired navigator echo having a specified field of view;

truncating said acquired navigator echo by means of a selectively positioned truncation window;

calculating a difference between linear phase shifts respectively associated with said truncated acquired navigator echo and said reference navigator echo;

displacing said truncation window by an amount representing said linear phase shift difference;

iteratively repeating said truncating, difference calculation, and truncation window displacement steps a specified number of times to provide a final phase shift difference or spatial displacement value;

employing said final phase shift difference value to determine the displacement of said object from said specified reference position when said MR data set is acquired; and accepting said MR data set for use in constructing an image of said object only if said determined displacement lies within a particular displacement window with respect to said reference position.

11. The method of claim 10 wherein:

a selected time-efficient algorithm is implemented to determine the linear phase shifts of said truncated acquired navigator echo and of said reference navigator echo.

12. The method of claim 11 wherein:

said selected time-efficient algorithm comprises an Ahn algorithm.

13. The method of claim 11 wherein:

the number of said iterations does not exceed three, and is a number which is less than three if the calculated displacements converge to zero in a number of iterations which is less than three.

14. The method of claim 11 wherein said truncating step comprises:

applying an inverse Fourier transform to said acquired navigator echo to provide a navigator profile in the frequency domain;

truncating the field of view of said navigator profile by applying said truncation window thereto; and Fourier transforming said truncated navigator profile to provide said truncated acquired navigator echo.

15. The method of claim 14 wherein:

said selectively positioned truncation window is applied to said reference navigator echo.

16. The method of claim 15 wherein:

said acquired MR image data comprises data for imaging any part of the anatomy where motion will degrade image quality.

17. The method of claim 16 wherein:

said acquired MR image data comprises data for coronary MR imaging.

18. The method of claim 16 wherein:

said acquired MR image data comprises data for abdominal body MR imaging.

19. Apparatus for constructing an MR image of an object disposed to experience periodic motion, said apparatus comprising:

a set of MR components operable to acquire a reference navigator echo associated with said object when said object is at a specified reference position, and further operable to acquire a set of MR image data when said object is selectively displaced from said reference position, said data set including an acquired navigator echo having a specified field of view;

a processor for truncating said acquired navigator echo, for calculating a difference between linear phase shifts respectively associated with said truncated acquired navigator echo and said reference navigator echo, and for displacing a truncation window associated with said truncated acquired navigator echo by an amount representing said linear phase shift difference; and said processor is further disposed to iteratively repeat said truncating, said difference calculation, and said truncation window displacement operations a specified number of times, in order to determine the displacement of said object from said specified reference position when said MR data set is acquired.

20. The apparatus of claim 19 wherein:

said processor is disposed to implement a selected time-efficient algorithm to determine the linear phase shifts of said truncated acquired navigator echo and of said reference navigator echo.

21. The apparatus of claim 20 wherein:

said selected time-efficient algorithm comprises an Ahn algorithm.

22. The apparatus of claim 20 wherein:

the number of said iterations does not exceed three, and is a number which is less than three if the calculated displacements converge to zero in a number of iterations which is less than three.

23. The apparatus of claim 22 wherein:

processor comprises means for applying an inverse Fourier transform to said acquired navigator echo in order to provide a navigator profile in the frequency domain, and further comprises means for truncating the field of view of said navigator profile by applying said truncation window thereto.

24. The apparatus of claim 23 wherein:

said processor comprises means for Fourier transforming said truncated navigator profile to provide said truncated acquired navigator echo.

* * * * *